(12) United States Patent
Kang et al.

(10) Patent No.: US 8,053,347 B2
(45) Date of Patent: Nov. 8, 2011

(54) METHOD OF MANUFACTURING SEMICONDUCTOR DEVICE

(75) Inventors: Hee-Soo Kang, Yongin-si (KR);
Byung-Kyu Cho, Seoul (KR);
Choong-Ho Lee, Yongin-si (KR);
Dong-Uk Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 266 days.

(21) Appl. No.: 12/379,190

(22) Filed: Feb. 13, 2009

(65) Prior Publication Data

US 2009/0221138 A1 Sep. 3, 2009

(30) Foreign Application Priority Data

Feb. 15, 2008 (KR) .................. 10-2008-0013988

(51) Int. Cl.
*H01L 21/3205* (2006.01)
(52) U.S. Cl. .. 438/592; 438/299; 438/664; 257/E21.593
(58) Field of Classification Search .................. 438/299, 438/592, 649, 651, 655, 658, 661–664; 257/E21.593, E21.622
See application file for complete search history.

(56) References Cited

U.S. PATENT DOCUMENTS

| 6,015,752 | A | * | 1/2000 | Xiang et al. | 438/655 |
|---|---|---|---|---|---|
| 6,858,899 | B2 | | 2/2005 | Walker et al. | |
| 7,042,770 | B2 | | 5/2006 | Lee et al. | |
| 7,253,467 | B2 | | 8/2007 | Lee et al. | |
| 2005/0280068 | A1 | | 12/2005 | Wang et al. | |
| 2006/0180851 | A1 | | 8/2006 | Lee et al. | |
| 2006/0228858 | A1 | | 10/2006 | Woo et al. | |
| 2007/0040225 | A1 | * | 2/2007 | Yang | 257/369 |
| 2007/0201275 | A1 | | 8/2007 | Takeuchi et al. | |
| 2007/0205445 | A1 | | 9/2007 | Park et al. | |
| 2009/0104742 | A1 | * | 4/2009 | Pas | 438/230 |

* cited by examiner

*Primary Examiner* — Thanhha Pham
(74) *Attorney, Agent, or Firm* — Lee & Morse, P.C.

(57) ABSTRACT

A method of manufacturing a semiconductor device, including forming a plurality of gate structures on a substrate, the gate structures each including a hard mask pattern stacked on a gate conductive pattern, forming an insulating layer pattern between the gate structures at least partially exposing a top surface of the hard mask pattern, forming a trench that exposes at least a top surface of the gate conductive pattern by selectively removing the hard mask pattern, and forming a silicide layer on the exposed gate conductive pattern.

17 Claims, 17 Drawing Sheets

METHOD OF MANUFACTURING SEMICONDUCTOR DEVICE

BACKGROUND

1. Field

Embodiments relate to a method of manufacturing a semiconductor device, and more particularly, to a method of manufacturing a semiconductor device that prevents the occurrence of a stringer.

2. Description of the Related Art

Because metal silicide has a low resistance and a high thermal stability, and is easily applied to a silicon process, it has been widely used in a VLSI interconnection process. In particular, because silicide layers formed on surfaces of a gate electrode and source/drain junctions may reduce the resistance of the gate electrode and contact resistance of the source/drain junctions, respectively, the silicide layers may greatly reduce interconnection resistance.

However, when a distance between word lines becomes narrow because of reduction of a design rule, an insulating layer may not completely fill the space between word lines and, as a result, a void may be formed. If a void is formed between word lines, metal may flow into the void when a metal layer is deposited on the semiconductor substrate prior to forming a silicide layer. Since metal in a void is not easily removed during a subsequent cleaning process, and may remain in the void, a stringer problem may occur.

SUMMARY

Embodiments are therefore directed to a method of manufacturing a semiconductor device, which substantially overcome one or more of the problems due to the limitations and disadvantages of the prior art.

It is therefore a feature of an embodiment to provide a method of manufacturing a semiconductor device that prevents exposure of voids formed between gate structures.

It is therefore another feature of an embodiment to provide a method of manufacturing a semiconductor device that prevents occurrence of a stringer.

At least one of the above and other features and advantages may be realized by providing a method of manufacturing a semiconductor device, including forming a plurality of gate structures on a substrate, the gate structures each including a hard mask pattern stacked on a gate conductive pattern, forming an insulating layer pattern between the gate structures at least partially exposing a top surface of the hard mask pattern, forming a trench that exposes at least a top surface of the gate conductive pattern by selectively removing the hard mask pattern, and forming a silicide layer on the exposed gate conductive pattern.

Forming the insulating layer pattern may include forming an insulating layer on the substrate including the gate structures, and at least partially exposing a top surface of the hard mask pattern by etching the insulating layer, wherein a portion of the insulating layer covering a first gate structure and a portion of the insulating later covering another gate structure adjacent to the first gate structure connect at a connecting point, and the connecting point is disposed at a position lower than the top surface of the hard mask pattern.

Forming the gate structures may further include forming a spacer on sides of the gate conductive pattern and the hard mask pattern prior to forming the insulating layer.

Forming the insulating layer pattern may further include planarizing the insulating layer to be substantially coplanar with a top surface of the hard mask layer, using the hard mask pattern as an etch-stop layer by a chemical mechanical polishing (CMP) process.

The connecting point may be disposed at a position higher than a bottom surface of the gate structures, so that the insulating layer defines a void formed between the gate structures, and wherein the top surface of the hard mask pattern is disposed at position higher than the connecting point.

Etching the insulating layer may not open the void.

Forming the silicide layer may include forming a metal layer in contact with the exposed gate conductive pattern after the hard mask pattern is removed, and annealing the structure including the metal layer, wherein the gate conductive pattern includes silicon.

The metal layer may include at least one of cobalt, nickel, tantalum, and molybdenum.

The method may further include forming an oxidation prevention layer on the metal layer prior to the annealing process.

The metal layer may conformally cover the exposed gate conductive pattern and insulating layer pattern, and a thickness of the metal layer is less than about half of the width of the trench.

The method may further include forming a silicon layer on the metal layer prior to the annealing process, wherein the metal layer undergoes a silicide reaction with the silicon layer on the metal layer and with the gate conductive pattern under the metal layer.

The method may further include etching at least a portion of the silicon layer and at least a portion of the metal layer to expose a top surface of the insulating layer pattern, and forming an oxidation prevention layer on an upper surface of the substrate including the exposed top surface of the insulating layer pattern prior to the annealing process.

The thickness of the metal layer may be about one-eighth (⅛) to about one-sixth (⅙) of a width of the trench.

The hard mask pattern may include a material having an etch selectivity with respect to the insulating layer and the gate conductive pattern, and forming the trench includes selectively removing the hard mask pattern using the etch selectivity.

At least one of the above and other features and advantages may also be realized by providing a method of manufacturing a semiconductor device, including forming a plurality of gate structures on a substrate, the gate structures each including a hard mask pattern stacked on a gate conductive pattern, forming an insulating layer pattern between the gate structures at least partially exposing a top surface of the hard mask pattern, forming a trench at least partially exposing a top surface of the gate conductive pattern by selectively removing the hard mask pattern, and forming a silicide layer on the gate conductive pattern by performing an annealing process after forming a metal layer on the structure including the trench, wherein forming the insulating layer pattern and the trench is performed so that a void formed between the gate structures is not exposed, thereby preventing the metal layer from entering the void.

The top surface of the hard mask pattern may be higher than a top portion of the void.

The method may further include forming a silicon layer on the substrate including the metal layer prior to the annealing process, wherein the metal layer reacts with the silicon layer disposed on the metal layer and the gate conductive pattern disposed under the metal layer, to form the silicide layer.

The method may further include forming an oxidation prevention layer on the substrate including the metal layer prior to the annealing process.

The metal layer may include at least one of cobalt, nickel, tantalum, and molybdenum.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION

Figure 1:
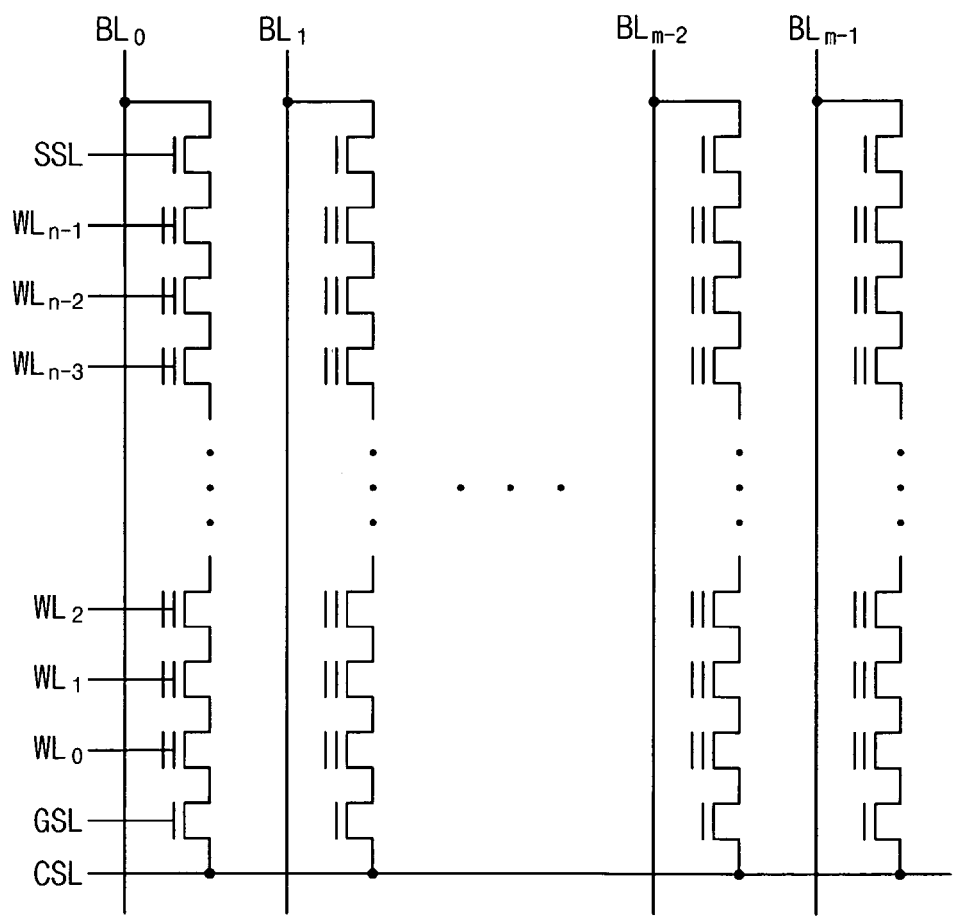
FIG. 1 illustrates a circuit diagram depicting a cell array of a semiconductor device according to an embodiment.

Korean Patent Application No. 2008-0013988, filed on Feb. 15, 2008, in the Korean Intellectual Property Office, and entitled: "Methods of Manufacturing Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a silicide" may represent a single compound, e.g., cobalt silicide, or multiple compounds in combination, e.g., cobalt silicide mixed with nickel silicide.

FIG. 1 illustrates a circuit diagram depicting a cell array of a semiconductor device according to an embodiment. In an embodiment, the semiconductor device may include a flash memory device.

Referring to FIG. 1, a ground selection line (GSL), a string selection line (SSL), and a plurality of word lines ($WL_0 \sim WL_{n-1}$) may be disposed on an active region of a semiconductor substrate. The word lines ($WL_0 \sim WL_{n-1}$) may be disposed between the ground selection line (GSL) and a string selection line (SSL). Bit lines ($BL_0 \sim BL_{m-1}$) crossing the word lines ($WL_0 \sim WL_{n-1}$) may be disposed on the word lines ($WL_0 \sim WL_{n-1}$). The bit lines ($BL_0 \sim BL_{m-1}$) may be connected to an active region of one side of the string selection line (SSL) and to a common source line (CSL). The common source line (CSL) may be parallel to the word lines ($WL_0 \sim WL_{n-1}$), and disposed in an active region of one side of the ground selection line (GSL).

Figure 2:
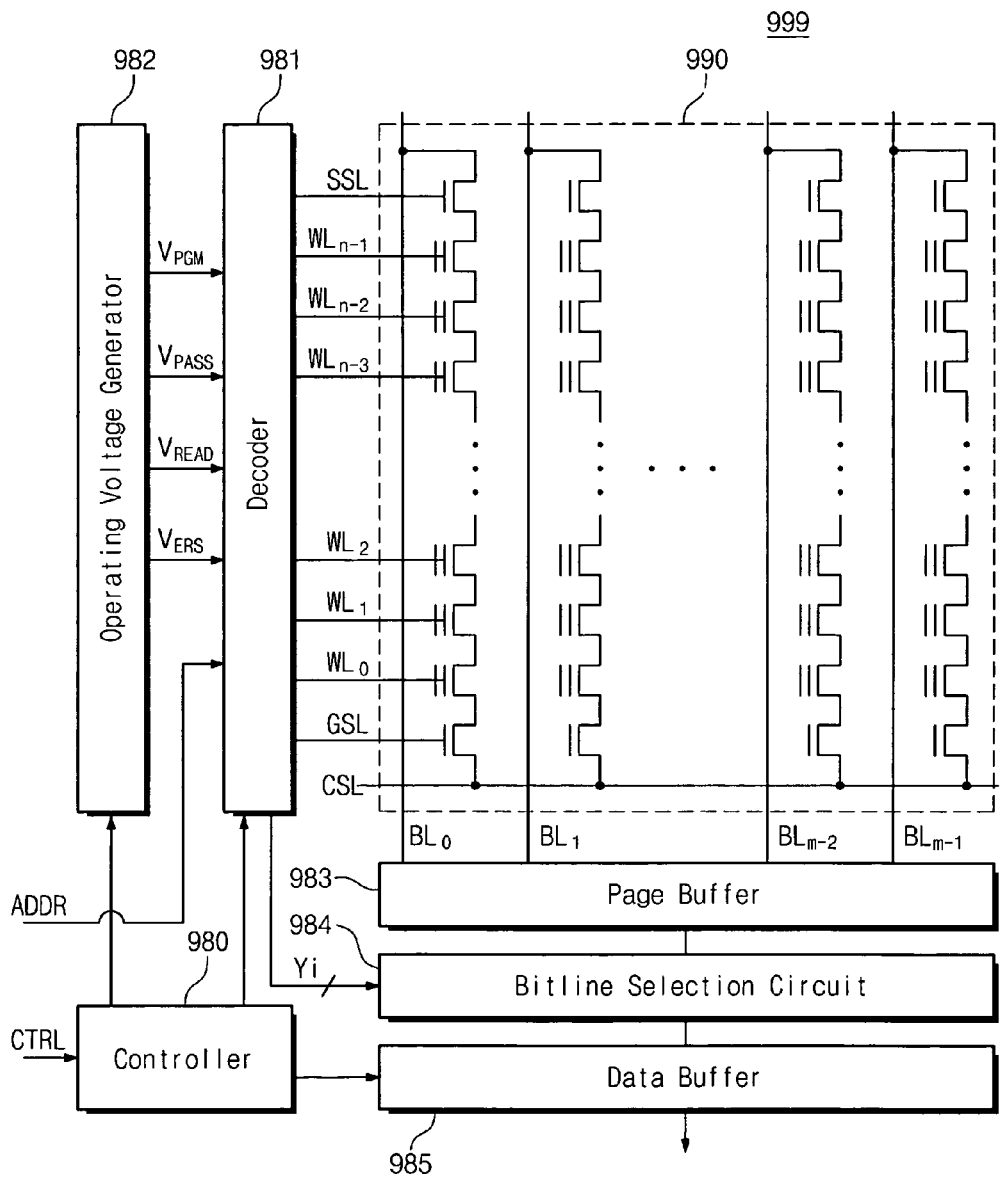
FIG. 2 illustrates a block diagram of a configuration of a semiconductor device according to an embodiment.

FIG. 2 illustrates a block diagram of a configuration of a semiconductor device according to an embodiment. Referring to FIG. 2, a NAND flash memory device 999 according to an embodiment may include a cell array 990, a decoder 981, an operation voltage generation circuit 982, a page buffer 983, a bit line selection circuit 984, a data buffer 985, and a control unit 980.

The memory cell array 990 may include a plurality of memory blocks and each of the memory blocks may include a plurality of pages, e.g., 32 pages or 64 pages. Each of the pages may include a plurality of memory cells, e.g., 512 Byte or 2 Kbyte, sharing a word line. In the case of NAND flash memory, an erase operation may be performed by a memory block unit, and a reading operation and a writing operation may be performed by a page unit.

The decoder 981 may be connected to the memory cell array 990 through the word lines ($WL_0 \sim WL_{n-1}$), and may be controlled by the control unit 980. After receiving an address (ADDR) from a memory controller (not shown), the decoder 981 may select a predetermined word line or generate a selection signal (Yi), so as to select a predetermined bit line.

The page buffer 983 may be connected to the memory cell array 990 through the bit lines ($BL_0 \sim BL_{m-1}$), and may store data loaded from the data buffer 985. A page of data may be loaded in the page buffer 983, and the loaded data may be concurrently programmed in a selected page, e.g., page 1, during a program operation. The page buffer 983 may read data from the page, e.g., page 1, selected during a reading operation, and may temporarily store the read data. The data stored in the page buffer 983 may be transferred to a memory controller (not shown) in response to a read enable signal (nRE, not shown).

The bit line selection circuit 984 may include a circuit for selecting a bit line in response to a selection signal (Yi). The data buffer 985 may include an input/output buffer used in data transferring between a memory controller (not shown) and the NAND flash memory 999. The control unit 980 may include a circuit for receiving a control signal (CTRL) from a memory controller (not shown), and controlling an inner operation of the NAND flash memory 999. The operation voltage generation circuit 982 may generate various voltages, e.g., a program voltage VPGM, a pass voltage VPASS, a read voltage VREAD, and an erase voltage VERS, used for an operation of the memory cell array 990 in response to the control unit 980.

Figure 3A:
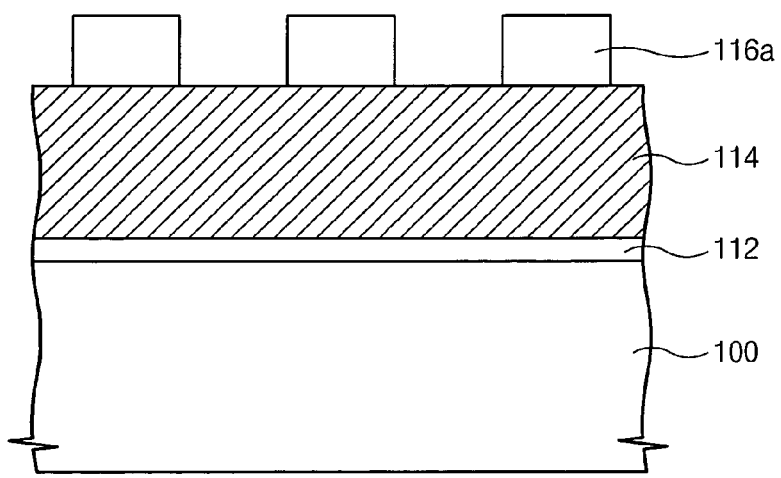
FIGS. 3A through 3G illustrate a method of manufacturing a semiconductor device according to an embodiment.

FIGS. 3A through 3G illustrate a method of manufacturing a semiconductor device according to an embodiment. Referring to FIG. 3A, a gate insulating layer 112, a gate conductive layer 114, and a hard mask pattern 116*a* may be sequentially formed on a semiconductor substrate 100.

The semiconductor substrate 100 may include a single crystalline bulk silicon substrate. The semiconductor substrate 100 may include a p-type semiconductor substrate into which a p-type impurity, e.g., boron (B), may be implanted.

A process of forming the gate insulating layer 112 may include, e.g., a thermal oxidation process or a chemical vapor deposition (CVD) process. The gate insulating layer 112 may include at least one of a silicon oxide layer, a hafnium oxide layer, a hafnium silicate layer, a zirconium oxide layer, a zirconium silicate layer, an aluminum oxide layer, and an aluminum silicate layer.

A process of forming the gate conductive layer 114 may include, e.g., a CVD process. The gate conductive layer 114 may be formed of, e.g., polysilicon. The thickness of the gate conductive layer 114 may be controlled by considering the desired thickness of a gate electrode to be formed in a subsequent process.

A process of forming the hard mask pattern 116*a* may include sequentially forming a hard mask layer and a photoresist layer on the gate conductive layer 114, and a process of patterning the hard mask layer using the photoresist layer as a mask. The hard mask pattern 116*a* may include, e.g., materials having an etch selectivity with respect to the gate insulating layer 112, the gate conductive layer 114, and an insulating layer 120, which will be described below. The hard mask pattern 116*a* may include at least one of a silicon nitride layer and a silicon oxynitride layer.

The hard mask pattern 116*a* may be used as an etching mask in a patterning process for patterning the gate insulating layer 112 and the gate conductive layer 114. In addition, the hard mask pattern 116*a* may be used as an etch-stop layer during a planarizing process, after forming an insulating layer 120 on an entire surface of the semiconductor substrate 100 and its included structures.

Because the thickness of the hard mask pattern 116*a* may determine the depth of a trench (T), which will be described later, the thickness of the hard mask pattern 116*a* may be controlled in consideration of the desired depth of the trench (T). In addition, exposure of a void (V) in the insulation layer 120 may be prevented by controlling the thickness of the hard mask pattern 116*a*.

Figure 3B:
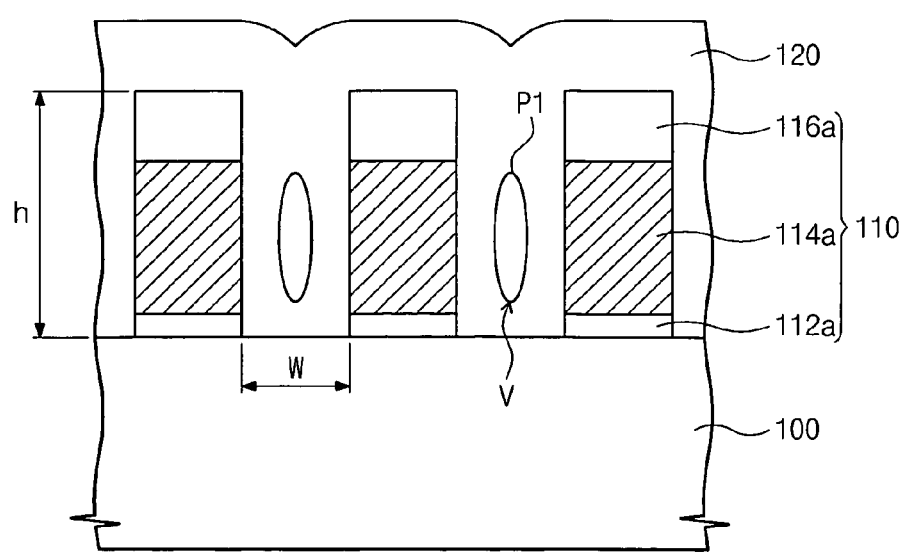

Referring to FIG. 3B, a patterning process may be performed, using the hard mask pattern 116*a* as a mask, to form gate structures 110. The insulating layer 120 may be formed on the entire surface of the structure including the gate structures 110, the substrate 100, etc.

The gate conductive layer 114 and the gate insulating layer 112 may be patterned, using the hard mask pattern 116*a* as an etching mask, to form a gate insulating pattern 112*a* and a gate conductive pattern 114*a*, respectively. According to an embodiment, the gate conductive pattern 114*a* may include, e.g., a floating gate electrode pattern, a gate insulating interlayer, and a control gate electrode.

The insulating layer 120 may include a layer, e.g., an oxide layer, having an etch selectivity with respect to the mask pattern 116*a*. The insulating layer 120 may be formed using, e.g., a CVD process.

Whether a void (V) is formed between the gate structures 110 may be determined by the method of forming the insulating layer 120, and/or an aspect ratio of the space between the gate structures 110. When the insulating layer 120 is formed using a deposition process having poor step coverage, e.g., a low pressure chemical vapor deposition (LPCVD) or physical vapor deposition (PVD), a void (V) may be formed between the gate structures 110. When the aspect ratio is large, the possibility that a void (V) may be formed increases, because the insulating layer 120 may not completely fill the space between the gate structures 110. The aspect ratio may be defined as a ratio of a height (h) of the gate structure 110 to a distance (w) between the gate structures 110.

A void (V) formed between the gate structures 110 may be surrounded by the insulating layer 120. Thus, the void (V) may not be exposed. When the insulating layer 120 is formed on the structure including the gate structures 110, the insulating layer 120 may form an overhang at a position between the adjacent gate structures 110. The position may be lower than a top surface of the gate structures 110. When forming the insulating layer 120, a portion of the insulating layer 120 covering a first gate structure 110 may connect at a connecting point (P1) to a portion of the insulating layer 120 covering a gate structure adjacent to the first gate structure 110. The connecting point (P1) may be disposed at a position lower than a top surface of the hard mask pattern 116*a*. Thus, the void (V) may be completely enveloped by the insulating layer 120 between the gate structures 110, so that the void (V) is unexposed.

Figure 3C:
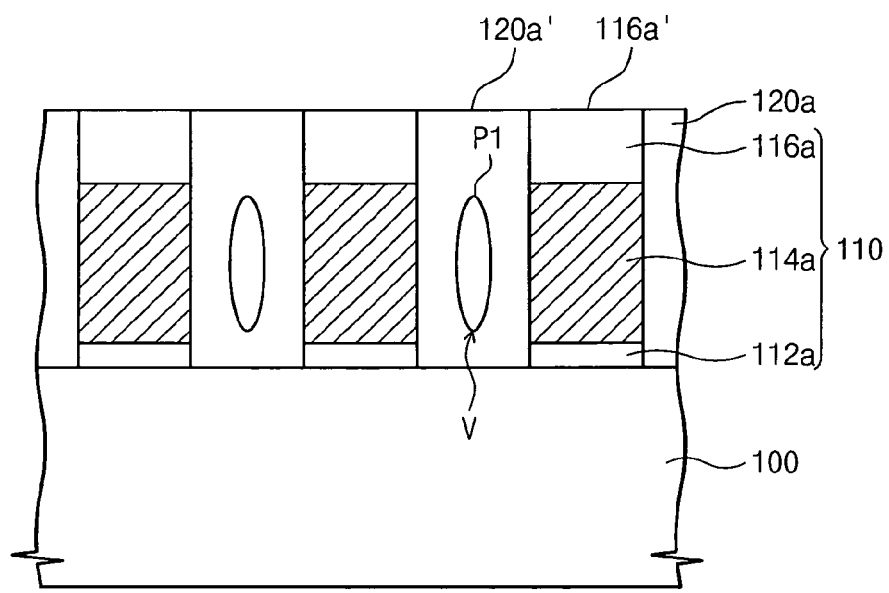

Referring to FIG. 3C, the insulating layer 120 may be etched to form an insulating layer pattern 120*a*, exposing a top surface 116*a*' of the hard mask pattern 116*a*. The insulating layer pattern 120*a* may be disposed between adjacent gate structures 110. The process of etching the insulating layer 120 may include a planarizing process using an etchant having an etch selectivity with respect to the hard mask pattern 116*a*. As a result, a top surface 120*a*' of the insulating layer pattern 120*a* may be substantially coplanar with a top surface 116*a*' of the hard mask pattern 116*a*. The planarizing process may include, e.g., an etch-back process or a chemical mechanical polishing (CMP) process.

If a void (V) formed between the gate structures 110 is exposed, i.e., opened, due to the planarizing process, a stringer problem may occur as a result of metal being deposited in the void. However, according to an embodiment, because the planarizing process may use the hard mask pattern 116*a* as an etch-stop layer, exposure of the void (V) may be prevented. As described above, the void (V) may be formed at a position lower than the top surface 116*a*' of the hard mask pattern 116*a*. Thus, if the top surface 120*a*' of the insulating layer pattern 120*a* is substantially coplanar with the top surface 116*a*' of the hard mask pattern 116*a*, exposure of the void (V) may be prevented, because the planarizing process may be stopped at a height of the top surface 116*a*' of the hard mask pattern 116*a*.

Figure 3D:
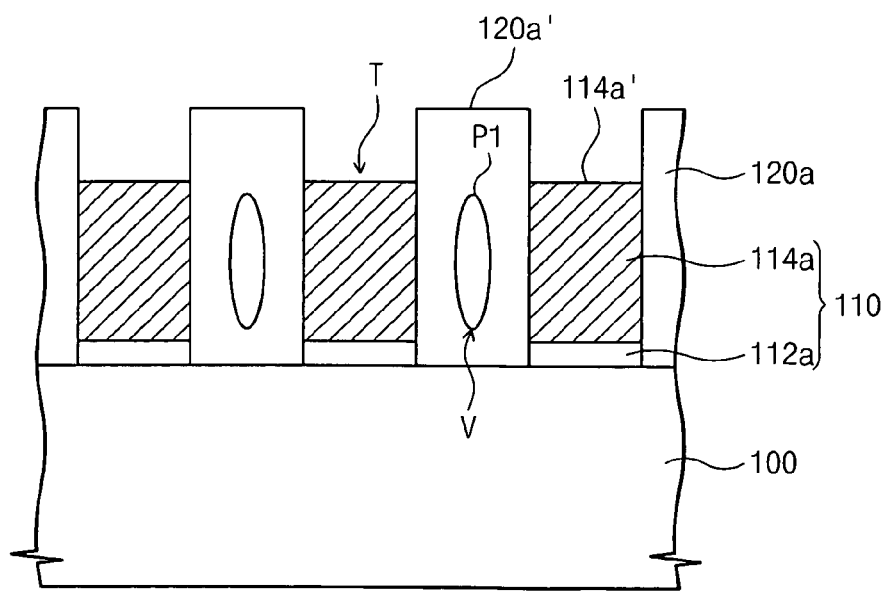

Referring to FIG. 3D, the exposed hard mask pattern 116*a* may be selectively etched to form a trench (T), exposing a top surface 114*a*' of the gate conductive pattern 114*a*. The hard mask pattern 116*a* may be selectively etched using an etchant selected so the etch rate of the hard mask pattern 116*a* is faster than etch rates of the insulating layer pattern 120*a* and the gate conductive pattern 114*a*. The etching process may include, e.g., wet etching or dry etching.

Figure 3E:
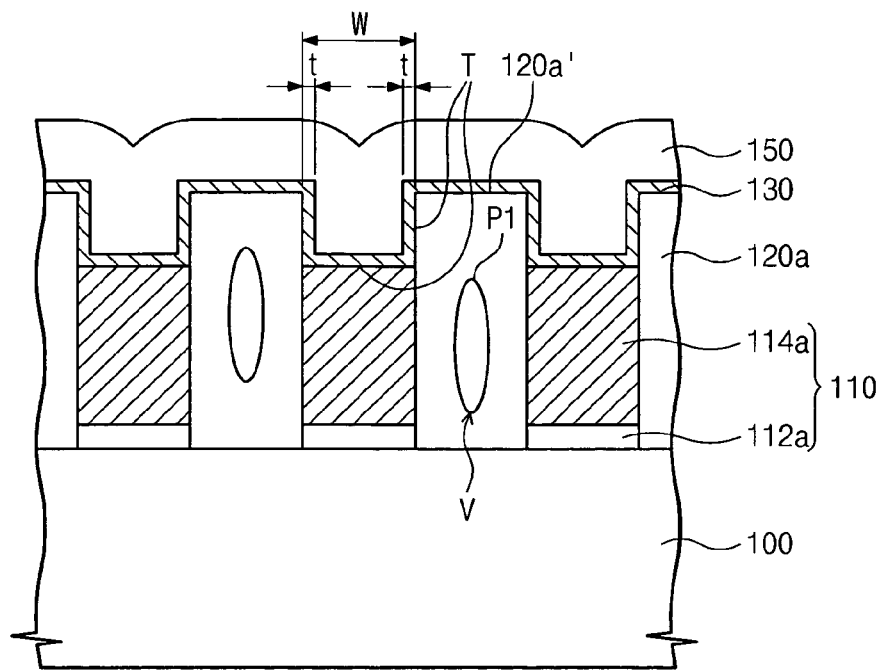

Referring to FIG. 3E, a metal layer 130 and an oxidation prevention layer 150 may be sequentially formed on a structure including the trench (T). The metal layer 130 may be formed to conformally cover the structure including the trench (T). The metal layer 130 may be formed using, e.g., a CVD process, an electroless deposition process, or a physical vapor deposition (PVD) process. The thickness of the metal layer 130 may be smaller than half of the width (w) of the trench (T). This may enable the oxidation prevention layer 150 to fill the trench (T) when forming the oxidation prevention layer 150. The metal layer 130 may include materials which form a silicide compound when reacted with the polysilicon gate conductive pattern 114a. The metal layer 130 may include at least one of cobalt (Co), nickel (Ni), tantalum (Ta), tungsten (W), and molybdenum (Mo).

The oxidation prevention layer 150 may cover an entire surface of the structure including the metal layer 130. The oxidation prevention layer 150 may completely fill the space in the trench (T) that was not filled with the metal layer 130. The oxidation prevention layer 150 may be formed using, e.g., a CVD process or a PVD process. The oxidation prevention layer 150 may include any suitable materials that may prevent oxidation of the metal layer 130. The oxidation prevention layer 150 may include at least one of titanium nitride (TiN), titanium tungsten (TiW), and silicon nitride.

The metal layer 130 may be relatively thin. If the metal layer 130 includes cobalt (Co), a silicide that is about 3.2 times to about 4.0 times as thick as the cobalt (Co) metal layer 130 may be formed. As the thickness of the cobalt (Co) metal layer 130 increases, the region of the gate conductive pattern 114a that is converted to a silicide layer may also increase. The size of the region of the gate conductive pattern 114a which forms the silicide layer may be reduced during the silicide process by forming a relatively thin metal layer 130 on the trench (T).

Figure 3F:
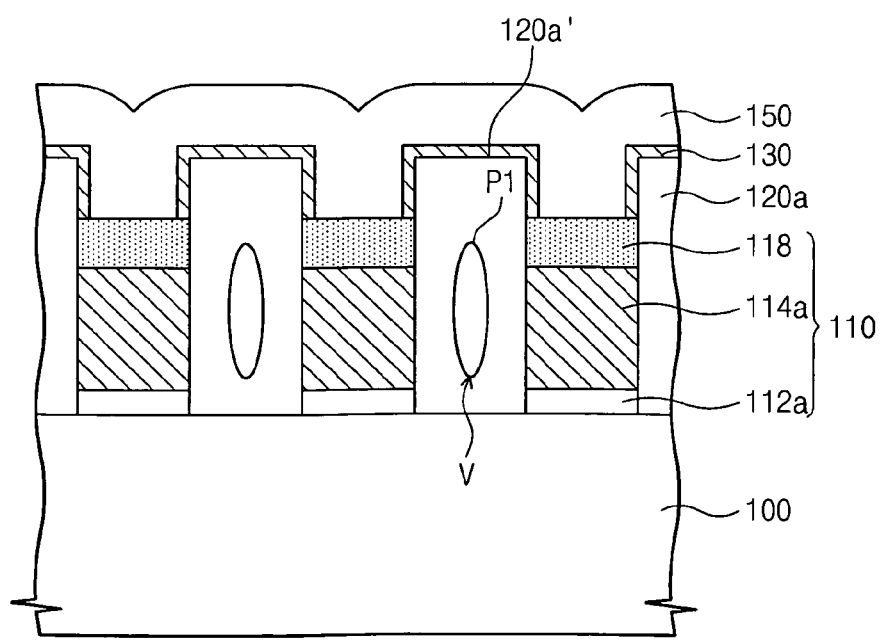

Referring to FIG. 3F, the metal layer 130 and the gate conductive pattern 114a may undergo a silicide reaction with one another. As a result, a silicide layer 118 may be formed on the gate conductive pattern 114a by a silicide process. The silicide process may include, e.g., a rapid thermal anneal (RTA) process or a furnace anneal process. The silicide layer 118 may include at least one of cobalt silicide ($CoSi_2$), nickel silicide ($NiSi_2$), tantalum silicide ($TaSi_2$), tungsten silicide ($WSi_2$), and molybdenum silicide ($MoSi_2$).

Figure 3G:
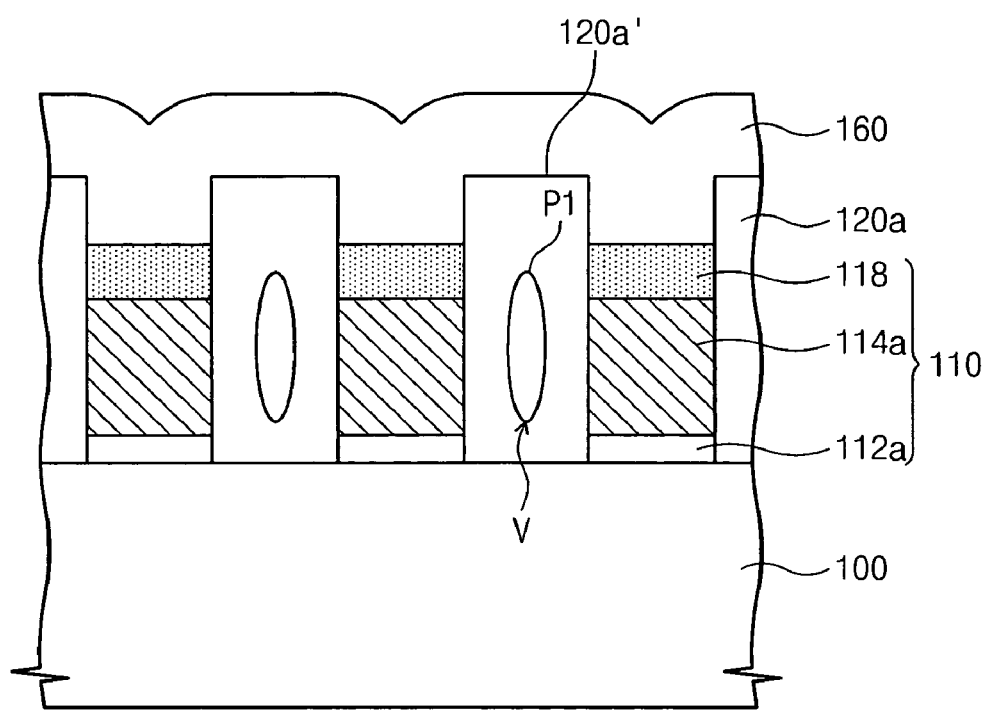

Referring to FIG. 3G, after forming the silicide layer is completed, the unreacted metal layer 130 and the oxidation prevention layer 150 may be removed. The process of removing the unreacted metal layer 130 and the oxidation prevention layer 150 may include, e.g., a wet etching process, a CMP process, and/or an etch-back process. An insulating interlayer 160 may be formed on the structure after removal of the unreacted metal layer 130 and the oxidation prevention layer 150.

As described above, according to an embodiment, even though a void (V) may be formed between the gate structures 110 during formation of the insulating layer 120, the void (V) may not be exposed until at least after the silicide process is performed. Therefore, a stringer phenomenon, which occurs when the metal layer 130 penetrates the void (V), may be prevented.

FIGS. 4A through 4E illustrate a method of manufacturing a semiconductor device according to another embodiment. The description of common features already discussed above will be omitted for brevity, while any new or different features will be described in further detail below.

Figure 4A:
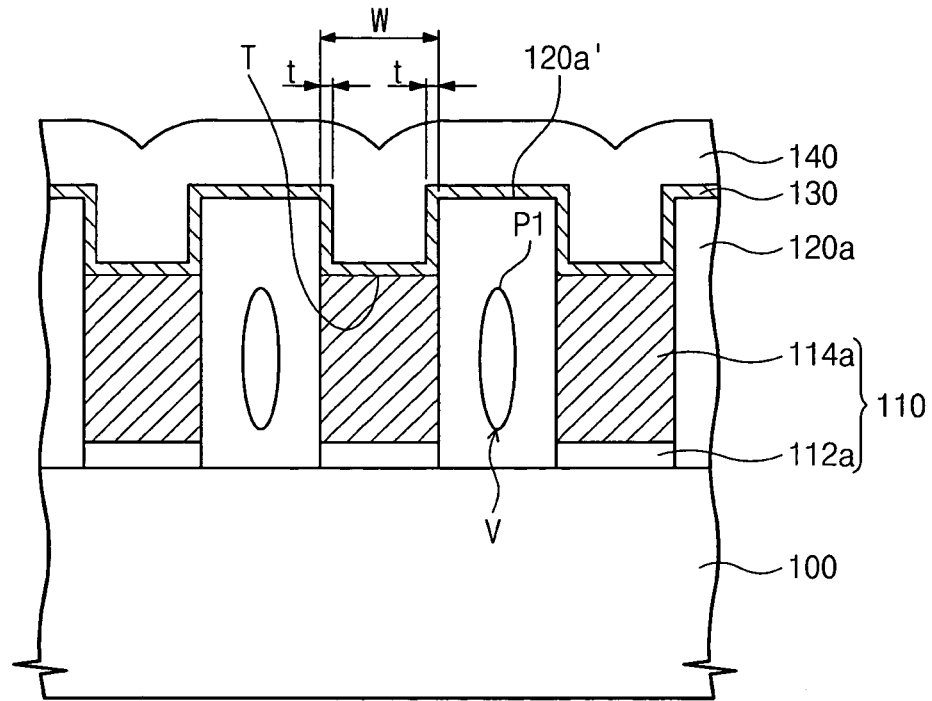
FIGS. 4A through 4E illustrate a method of manufacturing a semiconductor device according to an embodiment.

Referring to FIG. 4A, a metal layer 130 and a silicon layer 140 may be sequentially formed on the structure illustrated in FIG. 3D. Forming the metal layer 130 may be performed using the same method described above. The thickness of the metal layer 130 may be smaller than about half of the width (w) of the trench (T), which may allow the silicon layer to fill the trench (T).

The silicon layer 140 may cover an entire surface of the structure including the metal layer 130. The silicon layer 140 may include, e.g., material that forms a silicide compound when reacted with the metal layer 130. The silicon layer 140 may completely fill the space in the trench (T) that was not filled with the metal layer 130. In another embodiment, the silicon layer 140 may conformally cover an entire surface of a structure including the trench (T). The silicon layer 140 may be formed using, e.g., a CVD process and/or a PVD process.

Figure 4B:
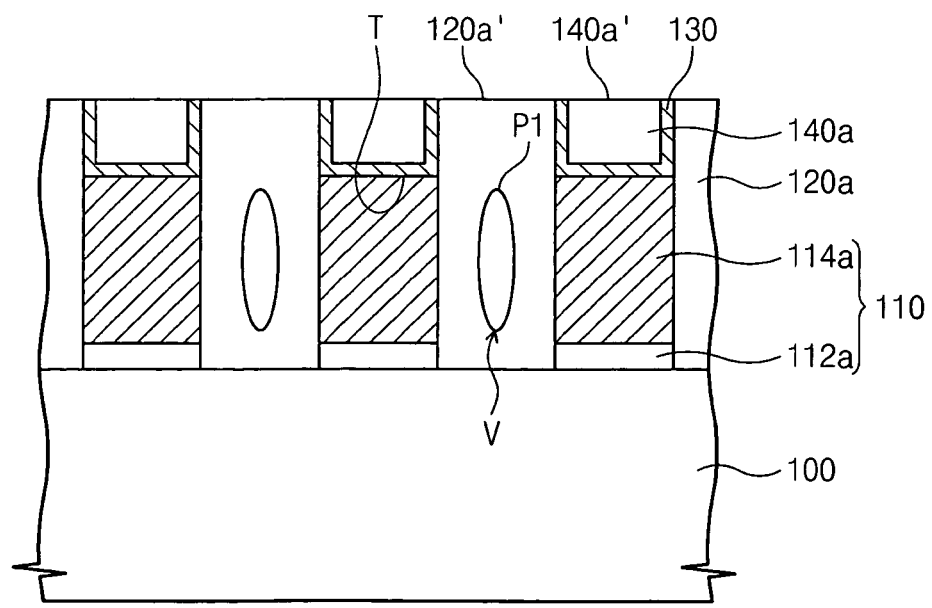

Referring to FIG. 4B, a structure including the silicon layer 140 may be etched to expose the insulating layer pattern 120a. The process of etching the silicon layer 140 may include a planarizing process, using the insulating layer pattern 120a as an etch-stop layer. The planarizing process may include, e.g., a CMP process and/or an etch-back process. As a result, a top surface 140a' of the silicon layer 140a remaining in the trench (T) may be substantially coplanar with a top surface 120a' of the insulating layer pattern 120a.

Figure 4C:
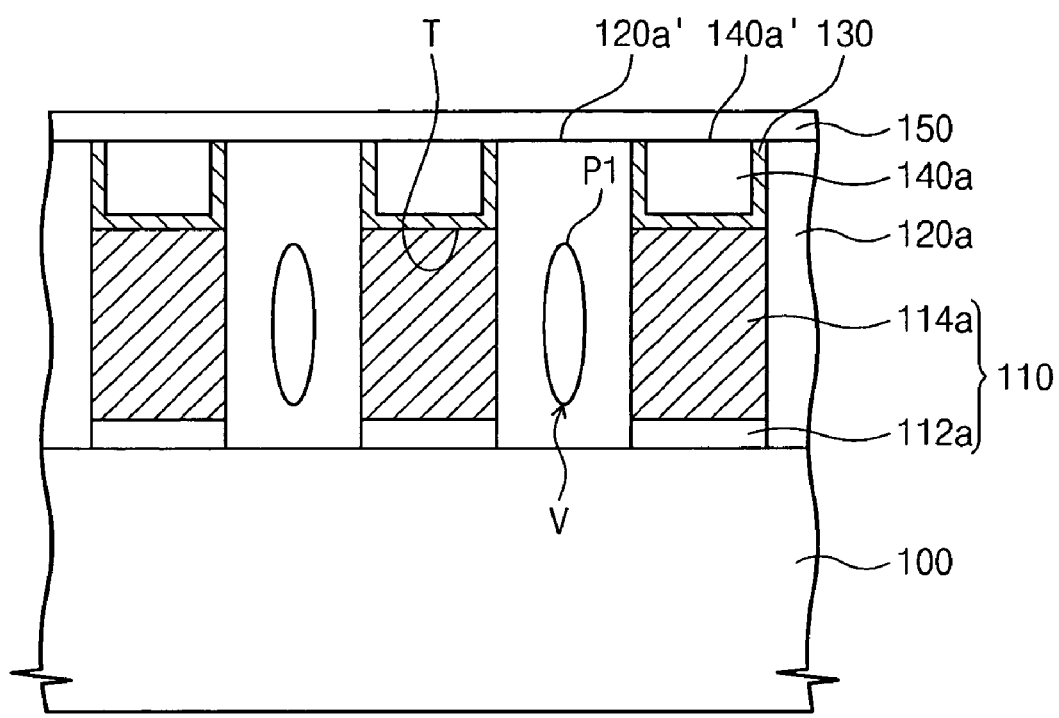
Figure 4D:
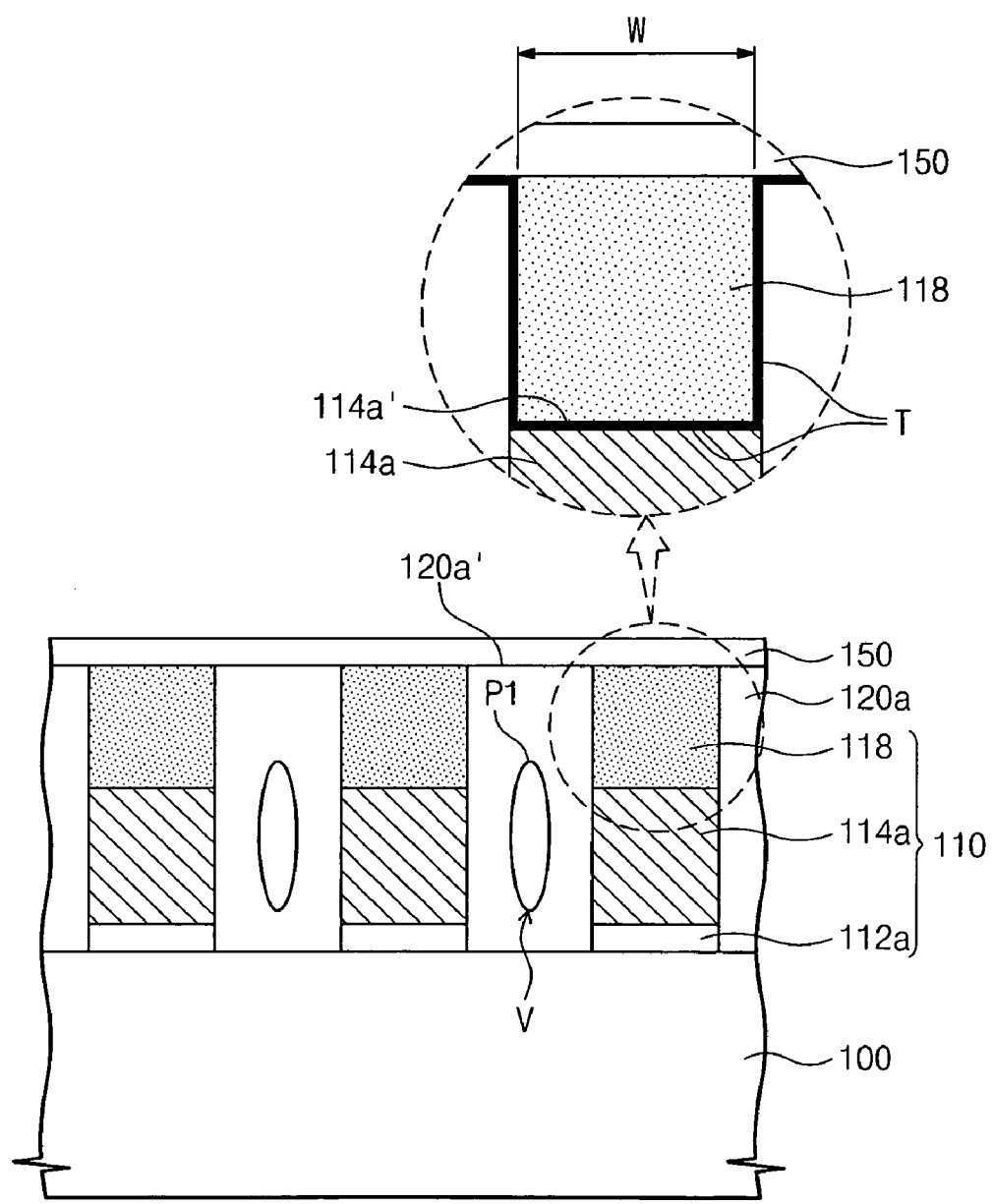

Referring to FIGS. 4C and 4D, an oxidation prevention layer 150 may be formed on an entire surface of the structure including the exposed insulating layer pattern 120a. The oxidation prevention layer 150 may conformally cover the structure including the exposed insulating layer pattern 120a. The oxidation prevention layer 150 may be formed using, e.g., a CVD process, an electroless deposition process, and/or a PVD process. The oxidation prevention layer 150 may include at least one of titanium nitride (TiN), titanium tungsten (TiW), and silicon nitride.

A silicide process may be performed on the structure including the oxidation prevention layer 150, to form a silicide layer 118 on a top surface of the gate conductive pattern 114a. The silicide process may form the silicide layer 118 on a top surface of the gate conductive pattern 114a by reacting the metal layer 130 with the gate conductive pattern 114a and the silicon layer 150 at the same time. The metal layer 130, which may be in contact with a bottom surface of the trench (T), may undergo a silicide reaction with the gate conductive pattern 114a and with the silicon layer 150, concurrently. The silicide process according to an embodiment may reduce the size of the region of the gate conductive pattern 114a that is converted to the silicide layer 118 when compared with the situation wherein the metal layer 130 is only reacted with the gate conductive pattern 114a, as in the embodiment described above.

If the metal layer 130 includes cobalt (Co), a silicide that is about 3.2 times to about 4.0 times as thick as the cobalt (Co) metal layer 130 may be formed. Thus, the thickness of the metal layer 130 may be controlled to thereby control the amount of silicidation. For example, the metal layer 130, particularly the metal layer formed on a top surface 114a' of the gate conductive pattern 114a, may have a thickness of about one-eighth (1/8) to about one-sixth (1/6) of the width (w) of the trench (T). Preferably, the metal layer 130 has a thickness of about five-thirty sixth (5/36) of the width (w) of the trench (T).

Figure 4E:
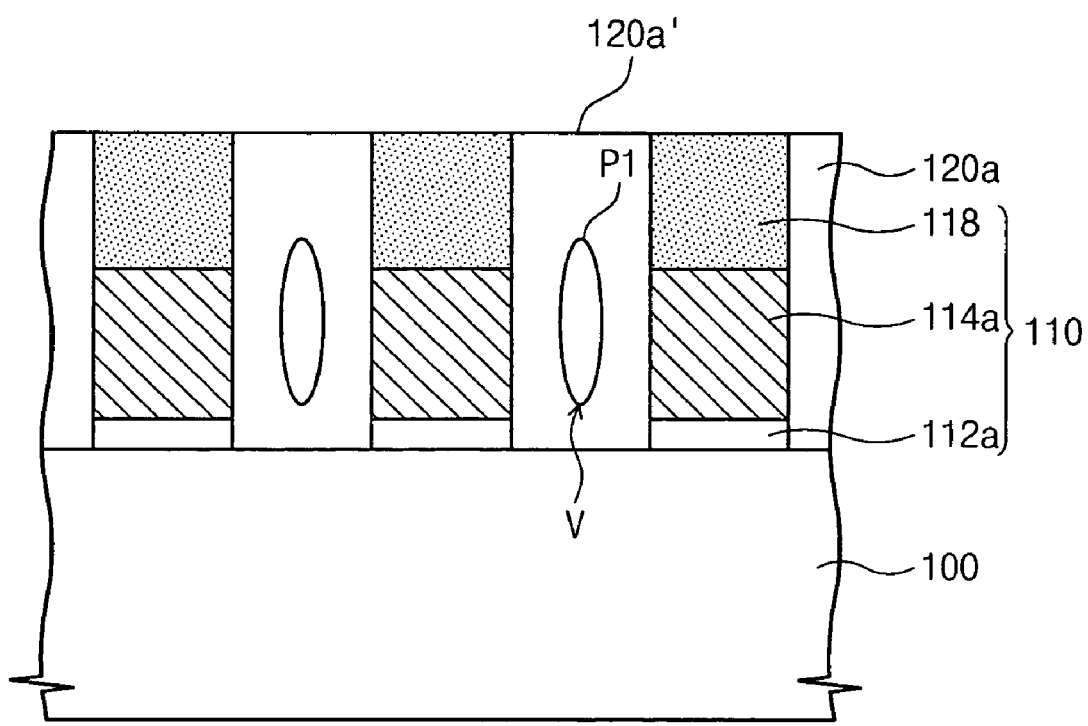

Referring to FIG. 4E, when the process of forming the silicide layer 118 is completed, a process of removing the oxidation prevention layer 150 may be performed. The process of removing the oxidation prevention layer 150 may include, e.g., a wet etching process, a CMP process, and/or an etch-back process.

A method of manufacturing a semiconductor device according to an embodiment may reduce the size of the region of the gate conductive pattern 114a that is converted to the silicide layer 118, compared with the embodiment described above. In addition, the method of manufacturing a semiconductor device according to a embodiment may form a conformal oxidation prevention layer 150, by further including a planarizing process, using the insulating layer pattern 120a as an etch-stop layer.

FIGS. 5A through 5I illustrate a method of manufacturing a semiconductor device according to an embodiment. The description of common features already discussed above will be omitted for brevity, while any new or different features will be described in further detail below.

Figure 5A:
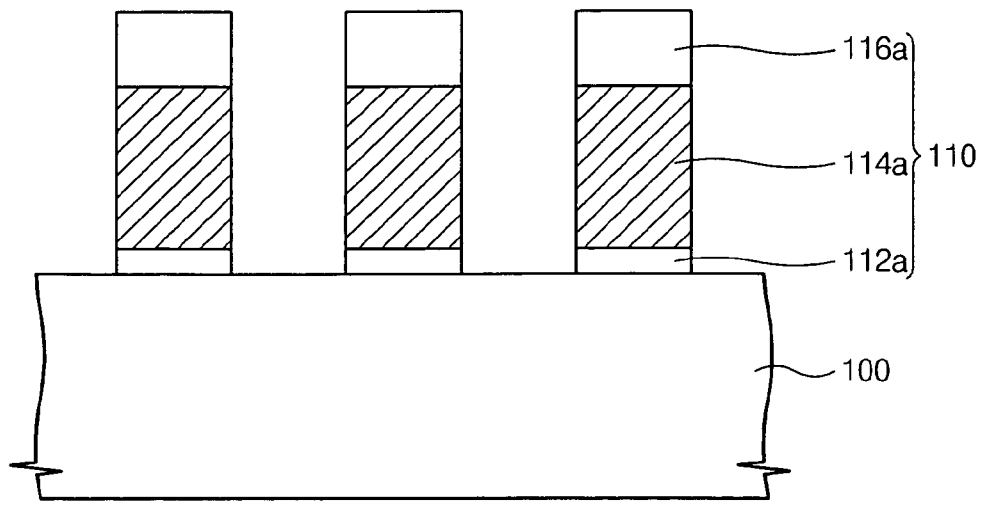
FIGS. 5A through 5I illustrate a method of manufacturing a semiconductor device according to an embodiment.
Figure 5B:
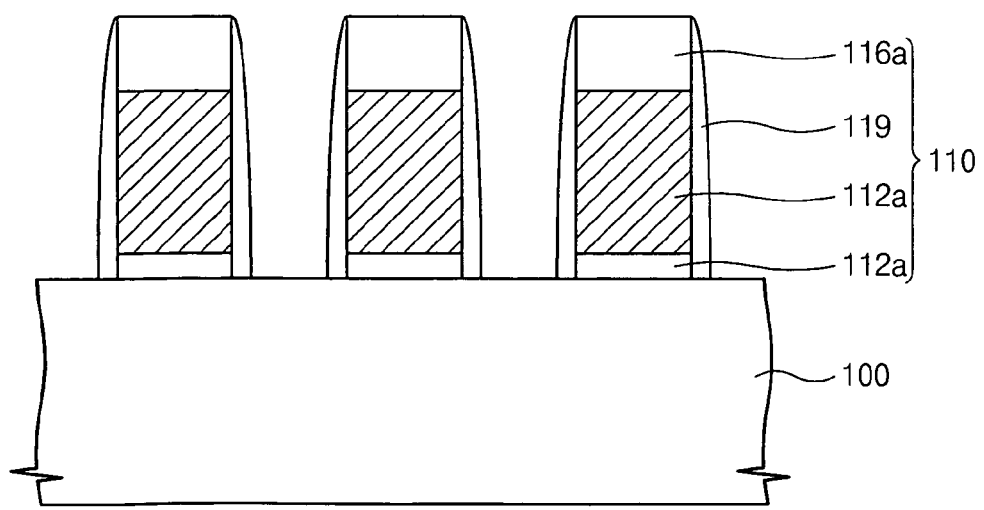

Referring to FIGS. 5A and 5B, a patterning process may be performed using the hard mask pattern 116a, as illustrated in FIG. 3A, as a mask to form the gate structures 110. The process of forming the gate structures 110 may further include a step of forming a spacer 119. After a spacer layer is conformally formed on an entire surface of the structure including a gate insulating pattern 112a, a gate conductive pattern 114a, and a hard mask pattern 116a, the spacer layer may be anisotropically etched to form the spacer 119. The spacer 119 may include, e.g., a silicon oxide layer.

An embodiment may further include a step of forming an impurity region in a substrate region (not shown), between the gate structures 110. An implantation process may be performed on a semiconductor substrate 100 where the gate structures 110 are formed, to form an impurity region in a substrate between the gate structures 110. The impurity region may include, e.g., source/drain regions. The source/drain regions may include, e.g., low concentration source/drain regions and high concentration source/drain regions.

Figure 5C:
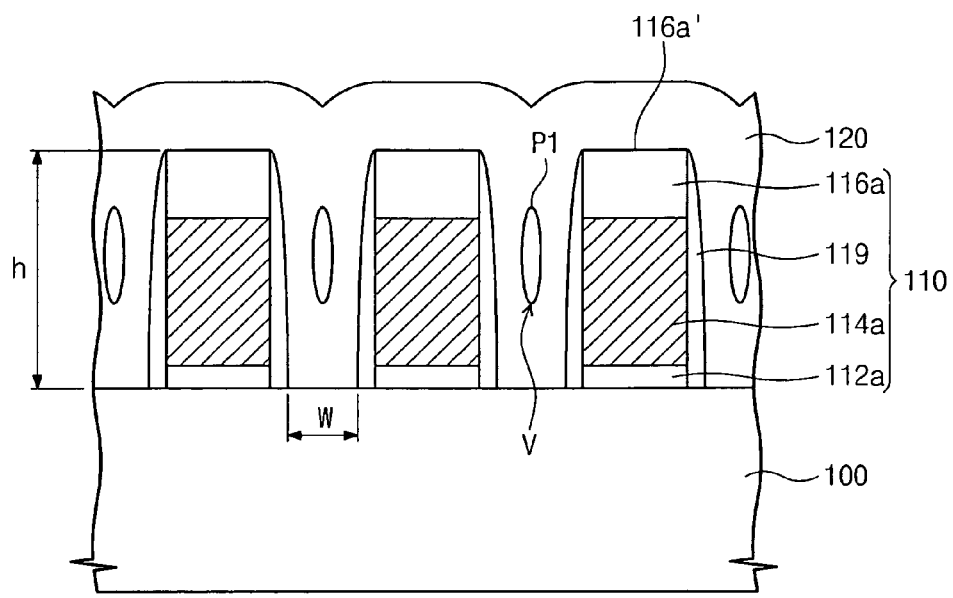
Figure 5D:
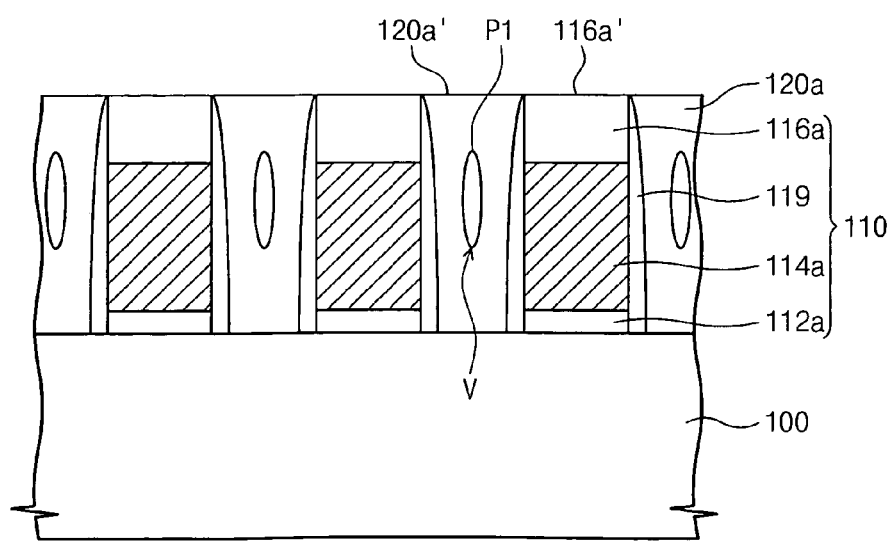

Referring to FIGS. 5C and 5D, an insulating layer 120 may be formed on a structure, including a spacer 119 formed on each side of the gate structures 110. The insulating layer 120 may include, e.g., an oxide layer. The structure including the insulating layer 120 may be planarized to expose at least a portion of a top surface 116a' of the hard mask pattern 116a.

Figure 5E:
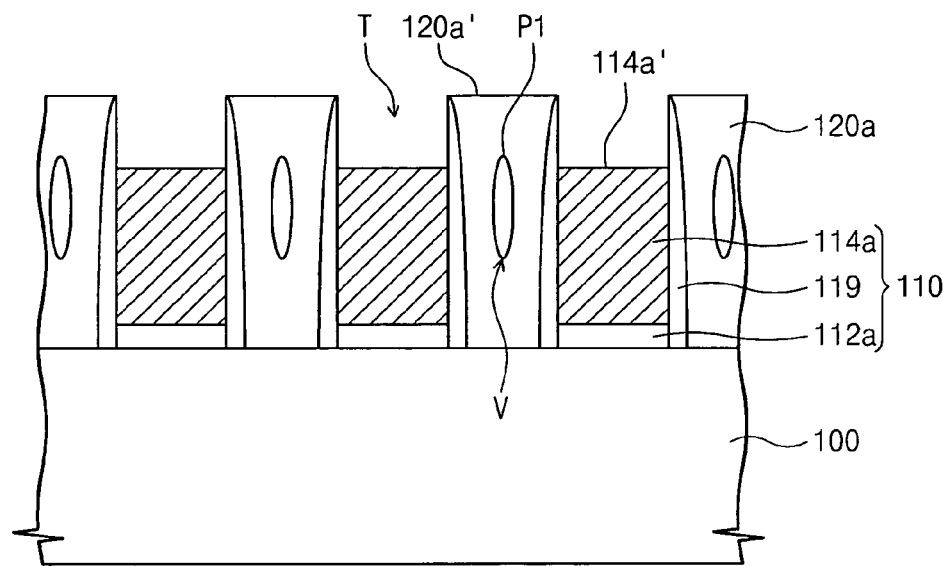

Referring to FIG. 5E, the exposed hard mask pattern 116a may be selectively removed to form a trench (T), exposing at least a portion of a top surface 114a' of the gate conductive pattern 114a. The process of forming the trench (T) may include, e.g., an etching process using an etchant having an etch selectivity with respect to the hard mask pattern 116a. The process of etching the hard mask pattern 116a may include, e.g., an isotropic wet etching process. The process of etching the hard mask pattern 116a may utilize an etchant having a high etch selectivity with respect to the hard mask pattern 116a so as not to damage the spacer 119 when removing the hard mask pattern 116a.

Figure 5F:
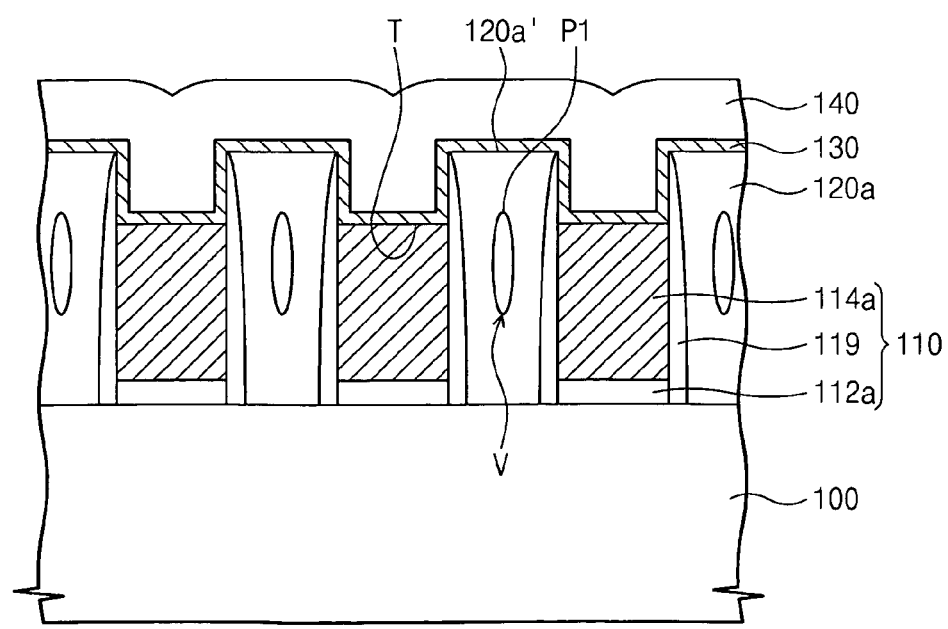

Referring to FIG. 5F, a metal layer 130 and a silicon layer 140 may be sequentially formed on a structure including the trench (T). Forming the metal layer 130 and the silicon layer 140 may be performed using the same methods as described above.

Figure 5G:
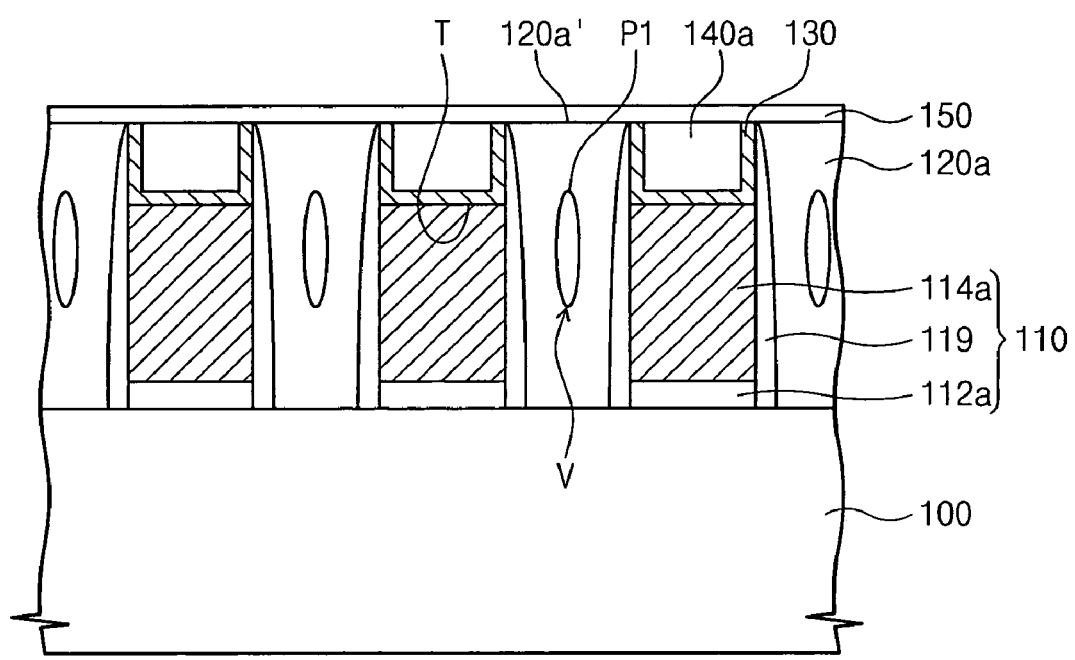

Referring to FIG. 5G, the structure including the silicon layer 140 may be etched to expose the insulating layer pattern 120a. An oxidation prevention layer 150 may be formed on an entire surface of the structure including the exposed insulating layer pattern 120a.

The process of etching the silicon layer 140 may include a planarizing process using the insulating layer pattern 120a as an etch-stop layer. As a result, a top surface of the silicon layer 140a formed in the trench (T) may be substantially coplanar with a top surface 120a' of the insulating layer pattern 120a.

The oxidation prevention layer 150 may conformally cover a structure including the exposed insulating layer pattern 120a. The oxidation prevention layer 150 may be formed using, e.g., a CVD process or an electroless deposition process.

Figure 5H:
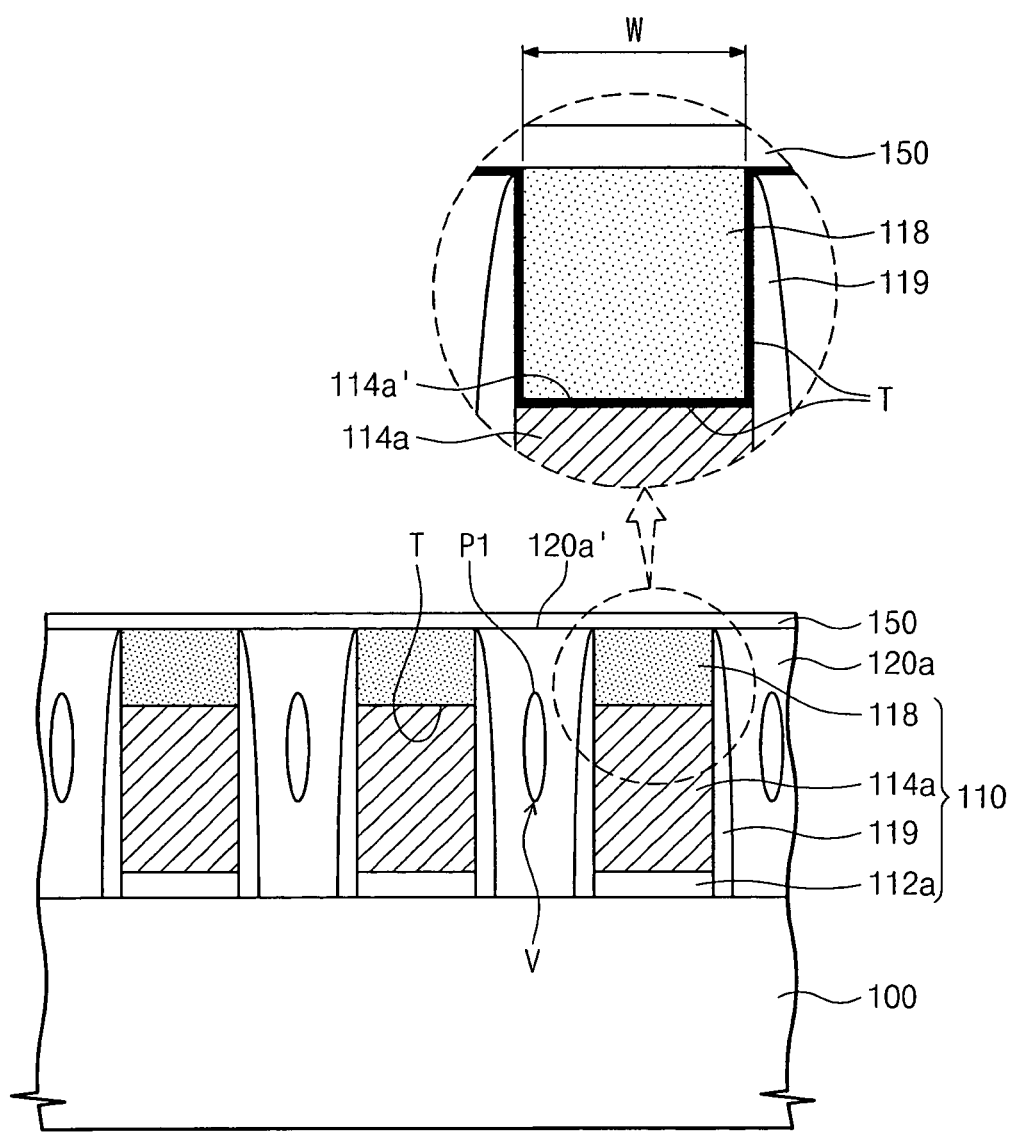
Figure 5I:
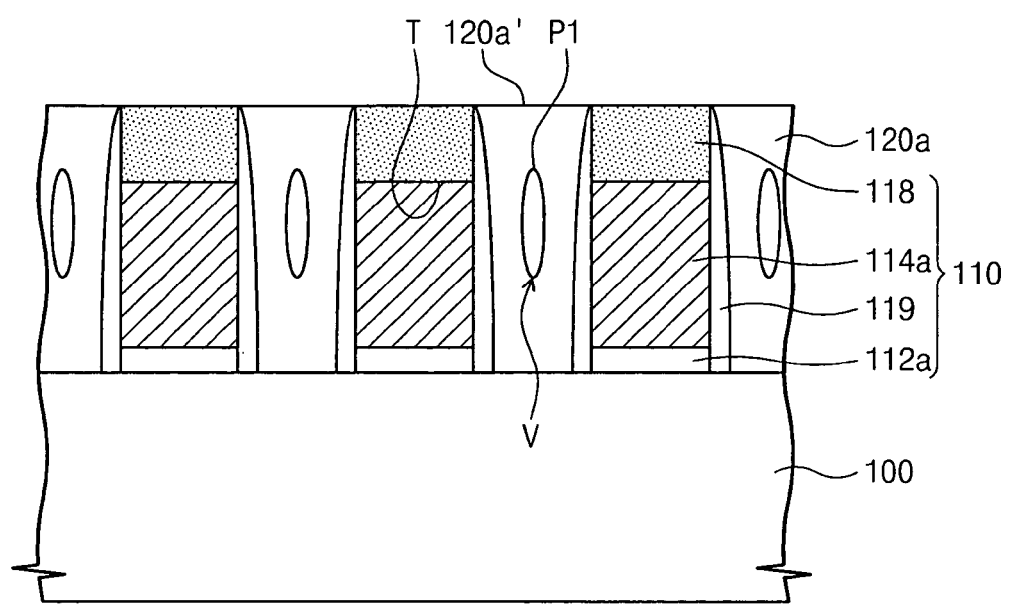

Referring to FIGS. 5H and 5I, a silicide process may be performed on the structure including the oxidation prevention layer 150, to form a silicide layer 118 on a top surface of the gate conductive pattern 114a. The oxidation prevention layer 150 may then be removed. This method of manufacturing a semiconductor device according to an embodiment may form the gate structures 110 including a spacer 119.

Figure 6:
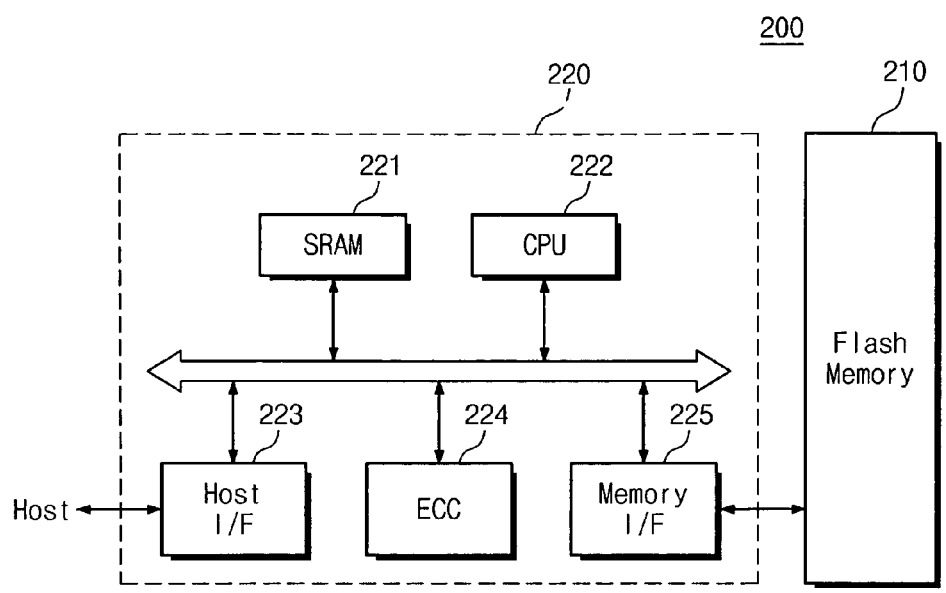
FIG. 6 illustrates a block diagram of an example of a memory card including a semiconductor device according an embodiment.

FIG. 6 illustrates a block diagram of a memory card including a semiconductor device manufactured according to an embodiment. The semiconductor device may include, e.g., a flash memory device. Referring to FIG. 6, a high capacity memory card 200 may include a flash memory device 210 according to an embodiment. The memory card 200 according to an embodiment may include a memory controller 220 controlling data exchange between a host (HOST) and the flash memory device 210.

SRAM 221 may be used as the operating memory of a processing unit 222. A host interface 223 may include a data exchange protocol of the host connected to the memory card 200. An error correction block 224 may detect and correct errors included in data read from the multi-bit flash memory device 210. A memory interface 225 may interface with the flash memory device 210. A processing unit 222 may perform various control operations for data exchange of the memory controller 220. The memory card 200 may further include read only memory (ROM) storing a cord data for interfacing with the host (HOST). The flash memory device of an embodiment may be used in a memory system, e.g., a solid state disk (SSD).

Figure 7:
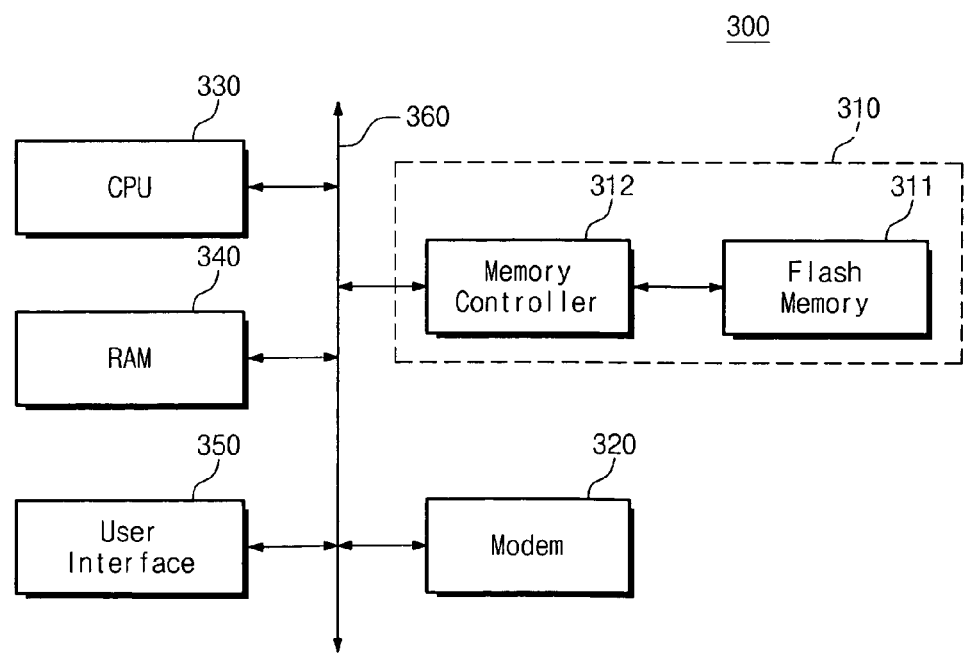
FIG. 7 illustrates a block diagram of an information treating system including a semiconductor device according to an embodiment.

FIG. 7 illustrates a block diagram of an information treating system including a semiconductor device manufactured according to an embodiment. The semiconductor device may include a flash memory system 310. Referring to FIG. 7, a flash memory system 310 of an embodiment may be built in an information treating system, e.g., a mobile product and/or a desk top computer. The flash memory system 310 may include, e.g., a flash memory device 311, including features of an embodiment described in FIGS. 1 through 5I, and a memory controller 312 controlling the flash memory device 311.

An information treating system 300 according to an embodiment may include a flash memory system 310, a modem 320, a central processing unit (CPU) 330, random access memory (RAM) 340, and a user interface 350. The modem 320, the central processing unit (CPU) 330, the random access memory (RAM) 340, and the user interface 350 may be electrically connected to a system bus 360, respectively. The flash memory system 310 may be configured to be substantially similar to the aforementioned flash memory device. The flash memory system 310 may store data treated by the central processing unit (CPU) 330, or data received from the outside. The flash memory system 310 described above may include, e.g., a solid state disk (SSD), and the information treating system 300 may stably store large amounts of data in the flash memory system 310. As reliability increases, the flash memory system 310 may reduce resources required for error correction, so that the flash memory system 310 may provide high speed data exchange to the information treating system 300. An application chipset, a camera image process (CIS), and input/output devices may also be used in the information treating system 300 according to an embodiment.

The semiconductor package according to an embodiment may be mounted by packages of various types. For example, the semiconductor package according to an embodiment, e.g., a flash memory device or a memory system, may be packaged by various methods, e.g., package on package (POP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline package (SOIP), shrink small outline package (SSOP), thin small outline package (TSOP), thin quad flat pack (TQFP), system in package (SIP), multi chip package (MCP), wafer-level fabricated package (WFP), wafer-level processed stack package (WSP), and be mounted.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor device, comprising:
    forming a plurality of gate structures on a substrate, the gate structures each including a hard mask pattern stacked on a gate conductive pattern;
    forming an insulating layer pattern between the gate structures at least partially exposing a top surface of the hard mask pattern;
    forming a trench that exposes at least a top surface of the gate conductive pattern by selectively removing the hard mask pattern; and
    forming a silicide layer on the exposed gate conductive pattern,
    wherein forming the insulating layer pattern includes:
        forming an insulating layer on the substrate including the gate structures; and
        at least partially exposing the top surface of the hard mask pattern by etching the insulating layer such that a portion of the insulating layer covering a first gate structure and a portion of the insulating later covering another gate structure adjacent to the first gate structure connect at a connecting point, and the connecting point is disposed at a position lower than the top surface of the hard mask pattern, and
    wherein the connecting point is disposed at a position higher than a bottom surface of the gate structures such that the insulating layer defines a void formed between the gate structures.

2. The method of manufacturing a semiconductor device as claimed in claim 1, wherein forming the gate structures further comprises:
    forming a spacer on sides of the gate conductive pattern and the hard mask pattern prior to forming the insulating layer.

3. The method of manufacturing a semiconductor device as claimed in claim 1, wherein forming the insulating layer pattern further comprises:
    planarizing the insulating layer by a chemical mechanical polishing (CMP) process using the hard mask pattern as an etch-stop layer such that the insulating layer is substantially coplanar with the top surface of the hard mask pattern.

4. The method of manufacturing a semiconductor device as claimed in claim 1, wherein etching the insulating layer does not open the void.

5. The method of manufacturing a semiconductor device as claimed in claim 1, wherein forming the silicide layer includes:
    forming a metal layer in contact with the exposed gate conductive pattern after the hard mask pattern is removed; and
    annealing the structure including the metal layer,
    wherein the gate conductive pattern includes silicon.

6. The method of manufacturing a semiconductor device as claimed in claim 5, wherein the metal layer includes at least one of cobalt, nickel, tantalum, and molybdenum.

7. The method of manufacturing a semiconductor device as claimed in claim 5, further comprising forming an oxidation prevention layer on the metal layer prior to the annealing process.

8. The method of manufacturing a semiconductor device as claimed in claim 5, wherein the metal layer conformally covers the exposed gate conductive pattern and insulating layer pattern, and a thickness of the metal layer is less than about half of the width of the trench.

9. The method of manufacturing a semiconductor device as claimed in claim 8, further comprising:
    forming a silicon layer on the metal layer prior to the annealing process, wherein the metal layer undergoes a silicide reaction with the silicon layer on the metal layer and with the gate conductive pattern under the metal layer.

10. The method of manufacturing a semiconductor device as claimed in claim 9, further comprising:
    etching at least a portion of the silicon layer and at least a portion of the metal layer to expose a top surface of the insulating layer pattern; and
    forming an oxidation prevention layer on an upper surface of the substrate including the exposed top surface of the insulating layer pattern prior to the annealing process.

11. The method of manufacturing a semiconductor device as claimed in claim 9, wherein a thickness of the metal layer is about one-eighth (⅛) to about one-sixth (⅙) of a width of the trench.

12. The method of manufacturing a semiconductor device as claimed in claim 1, wherein the hard mask pattern includes a material having an etch selectivity with respect to the insulating layer and the gate conductive pattern, and forming the trench includes selectively removing the hard mask pattern using the etch selectivity.

13. A method of manufacturing a semiconductor device, comprising:
    forming a plurality of gate structures on a substrate, the gate structures each including a hard mask pattern stacked on a gate conductive pattern;
    forming an insulating layer pattern between the gate structures at least partially exposing a top surface of the hard mask pattern;
    forming a trench at least partially exposing a top surface of the gate conductive pattern by selectively removing the hard mask pattern; and
    forming a silicide layer on the gate conductive pattern by performing an annealing process after forming a metal layer on the structure including the trench,
    wherein forming the insulating layer pattern and the trench is performed so that a void formed between the gate structures is not exposed, thereby preventing the metal layer from entering the void.

14. The method of manufacturing a semiconductor device as claimed in claim 13, wherein a top surface of the hard mask pattern is higher than a top portion of the void.

15. The method of manufacturing a semiconductor device as claimed in claim 13, further comprising forming a silicon layer on the substrate including the metal layer prior to the annealing process,
   wherein the metal layer reacts with the silicon layer disposed on the metal layer and the gate conductive pattern disposed under the metal layer, to form the silicide layer.

16. The method of manufacturing a semiconductor device as claimed in claim 13, further comprising forming an oxidation prevention layer on the substrate including the metal layer prior to the annealing process.

17. The method of manufacturing a semiconductor device as claimed in claim 13, wherein the metal layer includes at least one of cobalt, nickel, tantalum, and molybdenum.

* * * * *